(12) United States Patent
Zhu et al.

(10) Patent No.: US 11,802,925 B2
(45) Date of Patent: Oct. 31, 2023

(54) MAGNETIC RESONANCE IMAGING SYSTEM, POWER SUPPLY SYSTEM, AND POWER MANAGEMENT SYSTEM

(71) Applicant: CHENGDU YIJIAN MEDICAL TECHNOLOGY CO., LTD, Chengdu (CN)

(72) Inventors: Ruixing Zhu, Chengdu (CN); Zhizun Zhang, Chengdu (CN); Hangxuan Li, Chengdu (CN)

(73) Assignee: CHENGDU YIJIAN MEDICAL TECHNOLOGY CO., LTD, Chengdu (CN)

( * ) Notice: Subject to any disclaimer, the term of this patent is extended or adjusted under 35 U.S.C. 154(b) by 34 days.

(21) Appl. No.: 17/513,902

(22) Filed: Oct. 29, 2021

(65) Prior Publication Data
US 2022/0137166 A1    May 5, 2022

Related U.S. Application Data
(60) Provisional application No. 63/107,449, filed on Oct. 30, 2020.

(51) Int. Cl.
*G01R 33/383* (2006.01)
*G01R 33/38* (2006.01)
*G01R 33/385* (2006.01)

(52) U.S. Cl.
CPC ....... *G01R 33/383* (2013.01); *G01R 33/3802* (2013.01); *G01R 33/3852* (2013.01)

(58) Field of Classification Search
None
See application file for complete search history.

(56) References Cited

U.S. PATENT DOCUMENTS

| | | | |
|---|---|---|---|
| 11,175,430 B1* | 11/2021 | Shao | G01R 33/5608 |
| 2010/0072994 A1* | 3/2010 | Lee | G01R 33/383 |
| | | | 324/307 |
| 2020/0072925 A1* | 3/2020 | Julian | G01R 33/243 |
| 2020/0321651 A1* | 10/2020 | Campbell | B60L 58/22 |
| 2021/0121108 A1* | 4/2021 | Nashman | G01R 33/3808 |
| 2022/0075015 A1* | 3/2022 | Twieg | G01R 33/56341 |

* cited by examiner

*Primary Examiner* — Rodney E Fuller

(57) ABSTRACT

A magnetic resonance imaging (MRI) system with low-power miniaturization, a power supply system, and a power management system are provided. The MRI system includes: a permanent magnet using samarium-cobalt material, an MR console, a transmission RF chain, a receiving RF chain, gradient coils, gradient amplifiers, and a terminal device for user interactions. Each of above systems is a ultra-light and ultra-low-power ultra-low field brain MRI system for highly accessible healthcare applications.

20 Claims, 5 Drawing Sheets

MAGNETIC RESONANCE IMAGING SYSTEM, POWER SUPPLY SYSTEM, AND POWER MANAGEMENT SYSTEM

CROSS REFERENCE TO RELATED APPLICATIONS

This application claims priority to U.S. Provisional Application No. 63/107,449, filed Oct. 30, 2020, which is hereby incorporated by reference herein as if set forth in its entirety.

BACKGROUND

1. Technical Field

The present disclosure relates to magnetic resonance imaging technology, and particularly to a magnetic resonance imaging system with low-power miniaturization, a power supply system, and a power management system.

2. Description of Related Art

Magnetic resonance imaging (MRI) has impacted modern healthcare tremendously and is recognized by clinicians as the most valuable medical device innovation in the last three decades. MRI is now a routine procedure in diagnosis and management of various diseases and injuries, and over 100 million MRI investigations are performed each year worldwide. It is the most powerful diagnostic imaging modality because of its capability in detecting and characterizing pathological tissues with high sensitivity and specificity in an inherently quantitative, non-invasive and non-ionizing manner.

However, despite the clear advantages and clinical impact of MRI in healthcare, its accessibility is low and extremely in homogeneous worldwide. MRI is not generally available outside radiology departments and centralized large imaging facilities in developed countries. It is further rarely available in developing and underdeveloped countries. It is estimated that about 70% of the world's population have little to no access to MRI and the benefits that it entails. This scenario occurs for several reasons. First, the conventional complex high-field superconducting MRI scanners (1.5 T and 3.0 T) are expensive. Second, they are extremely expensive to install and maintain due to extensive infrastructural requirements and modifications needed to site the scanners, and use of cryogenic helium (a rare, non-renewable resource). Third, these scanners are complex and costly to operate requiring highly trained radiographic technicians. Meanwhile, there clearly exist unmet clinical needs for MRI in various healthcare sectors outside radiology departments and large centralized imaging centers. For example, neurotrauma treatment (i.e., acute stroke and hemorrhage), hypoxic neonatal brain injuries, tumor, post-operative tumor localization, and general brain imaging in trauma center, neonatal/pediatric clinics, and neurology department.

Hence, the technology development priority should be to develop MRI scanners that are accessible, patient-centric and site-agnostic for their wider integration across various healthcare sectors at low costs.

BRIEF DESCRIPTION OF THE DRAWINGS

To describe the technical schemes in the embodiments of the present disclosure or in the prior art more clearly, the following briefly introduces the drawings required for describing the embodiments or the prior art. It should be understood that, the drawings in the following description merely show some embodiments of the present disclosure. For those skilled in the art, other drawings can be obtained according to the drawings without creative efforts.

DETAILED DESCRIPTION

In the following descriptions, for purposes of explanation instead of limitation, specific details such as particular system architecture and technique are set forth in order to provide a thorough understanding of embodiments of the present disclosure. However, it will be apparent to those skilled in the art that the present disclosure may be implemented in other embodiments that are less specific of these details. In other instances, detailed descriptions of well-known systems, devices, circuits, and methods are omitted so as not to obscure the description of the present disclosure with unnecessary detail.

In view of the problems in the above related art, the applicants develop portable and battery-operated ultra-light and ultra-low-power ultra-low field (ULF) MRI technologies for highly accessible healthcare applications.

For the purpose of describing the technical solutions of the present disclosure, the following describes through specific embodiments.

Figure 1:
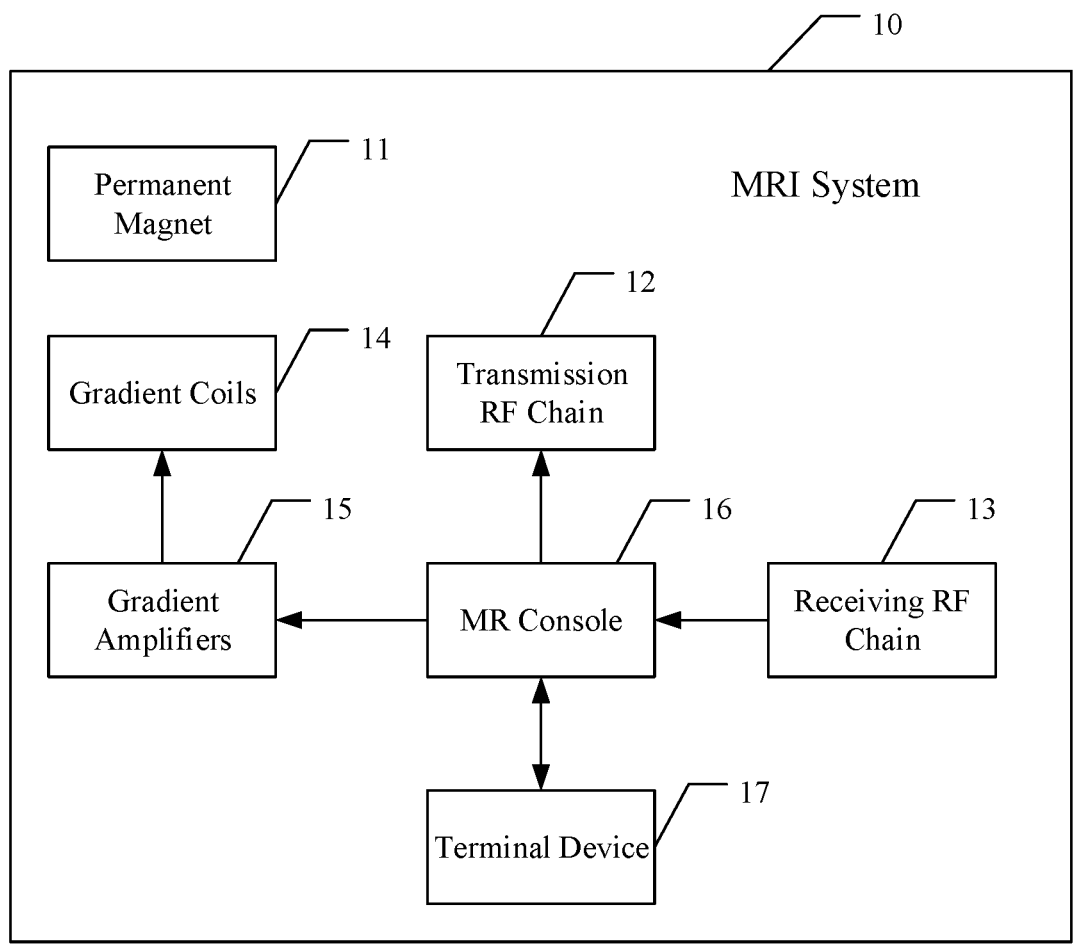
FIG. 1 is a schematic block diagram of an embodiment of an MRI system with low-power miniaturization according to the present disclosure.

FIG. 1 is a schematic block diagram of an embodiment of an MRI system with low-power miniaturization according to the present disclosure. For the convenience of explanation, only the parts related to this embodiment are shown. In this embodiment, as shown in FIG. 1, the MRI system 10 with low-power miniaturization includes: a permanent magnet 11 using Samarium-Cobalt (SmCo) material, a transmission radio frequency (RF) chain 12, a receiving RF chain 13, gradient coils 14, gradient amplifiers 15, an MR console 16, and a terminal device 17 for user interactions. A gradient generator is integrated in th MR console 16. The MR console 16 is used to generate gradient waveforms for three predefined orthogonal directions, which can be amplified by gradient amplifiers, driven gradient coils to form gradient magnetic field, and used for spatial encoding. The MR console 16 is also used to generate RF waveforms, which can be further amplified by RF amplifiers, driven RF transmission coils to produce RF field and excite spins within the imaging region. The MR console 16 can also convert the amplified receiving RF signals into digital signals (namely data acquisition), and transfer the signals to the terminal for further processing. The MR console 16 accurately controls the timing for gradient/RF waveforms generation and data acquisition. The terminal device 17 is electrically coupled to the MR console 16 and used for managing the MRI system 10. Each of the transmission RF chain 12 and receiving RF chain 13 includes: RF coils, a RF generator integrated in MR console 16, and RF amplifiers.

Superconducting magnet consumes energy for cryocooler to maintain the superconducting temperature, which is approximately about 4 kW, plus other high-power-consuming electronics including gradient amplifier and RF amplifier subsystems. For electromagnet, the power dissipation increases dramatically to about 2 kW at a field strength of 50 mT, and standard water cooling is usually required.

In this embodiment, the permanent magnet with SmCo material will be used for its stability against temperature drift. At ultra-low field, the RF power consumption is also minimized.

In some embodiments, the MRI system 10 is operated using a standard alternating current (AC) power socket (e.g., 10 A/220V in China and other regions, 15 A/110V in US and other regions), or a battery packet for 12 hours operation per charge, or a portable generator. The specs for power consumption of the MRI system 10 is the peak <1000 W, the average <200 W, and the standby <100 W.

In some embodiments, the terminal device 17 is a personal desktop computer, or a mobile terminal device. For example, a laptop or tablet will be used instead of traditional PC-based user interactions.

In some embodiments, the MRI system further includes a motor system and a display. The motor system will be used for moving a patient bed or lifting a machine, and the motor system will be turned off when the patient is properly positioned. The display will be used for providing a user interface and displaying the MRI obtained by the MRI system.

Figure 2:
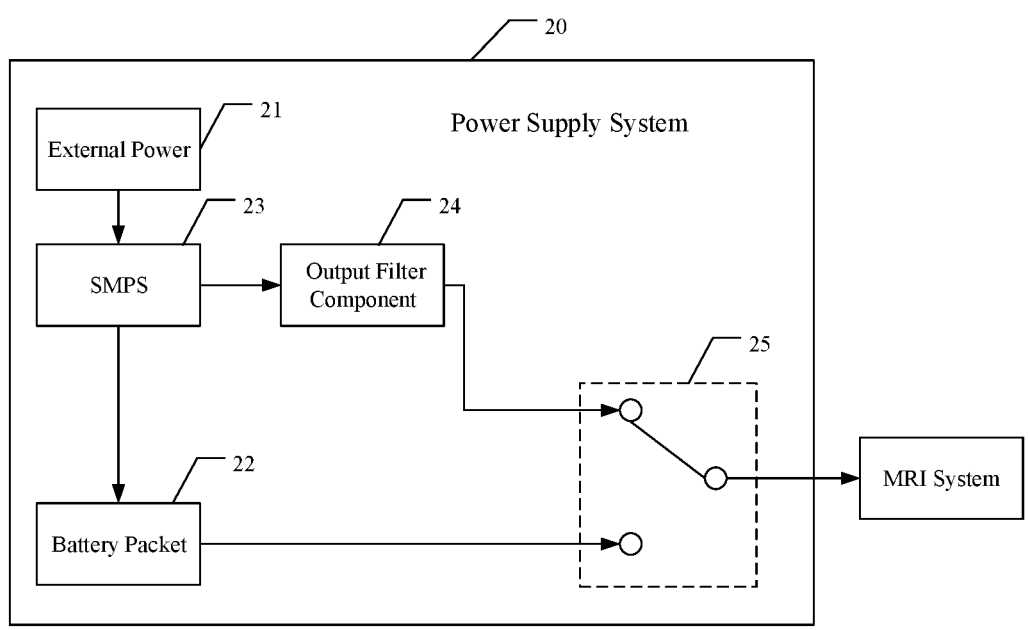
FIG. 2 is a schematic block diagram of an embodiment of a power supply system for supplying power to the MRI system with low-power miniaturization according to the present disclosure.

FIG. 2 is a schematic block diagram of an embodiment of a power supply system for supplying power to an MRI system with low-power miniaturization according to the present disclosure. For the convenience of explanation, only the parts related to this embodiment are shown. In this embodiment, as shown in FIG. 2, a power supply system 20 for supplying power to an MRI system with low-power miniaturization includes: an external power 21, a battery packet 22, a switched-mode power supply (SMPS) 23, and an output filter component 24 (e.g., a large capacitor).

The external power 21 is used to supply alternating current (AC) power. In some embodiments, the external power 21 is a standard AC power socket or a portable generator.

The input of the SMPS 23 is connected to the external power 21, and the SMPS 23 is used to transfer the AC power (e.g., from the AC socket or the portable generator) to the direct current (DC) load. The SMPS 23 is advantageous in having high power conversion efficiency, and it is substantially smaller and lighter than a linear supply due to the smaller transformer size and weight, which allows the whole system to have a compact and light design.

The output filter component 24 is connected to the output of the SMPS 23, and is used to improve the stability of the DC output of the SMPS 23.

In some embodiments, the power supply system 20 further includes a power switch 25. A common end of the power switch 25 is connected to the output filter component 24 and the battery packet 22, and a fixed contact of the power switch 25 is connected to the MRI system. Through the power switch 25, the MRI system can be operated without the battery packet 22, when the external power 21 is available, or the MRI system can be driven by the battery packet 22 when the external power 21 is not available. The MRI system can also been driven by the external power while the battery packet is charging.

In some embodiments, the MRI system can also be powered by external power 21, i.e., directly connected to the SMPS 23.

In some embodiments, the output filter component 24 is built with at least one inductor, or at least one capacitor, or combinations of the at least one inductor and the at least one capacitor.

In some embodiments, the portable generator is driven by solar power or fuel.

In some embodiments, each charge of the battery packet 22 is performed within 4 hours with the standard AC power socket, and used for 12 hours operation.

In some embodiments, the battery packet 22 is made of lithium-ion, or Li-ion polymer material. Despite various choices of battery materials, including lead-acid ("flooded", deep-cycle, and VRLA), NiCd, nickel-metalhydride, lithium-ion, and Li-ion polymer. In some embodiments, lithium-ion and Lithium polymer battery will be used for their high energy density compared to their weight. They are also most common battery type in modern electric cars. For example, the 85 kWh battery pack (used in Tesla Model S) weighs 540 kg and contains 7104 lithium-ion battery cells in 16 modules wired in series.

In some embodiments, the power supply system 20 design will allow fast battery swapping (<5 min), which also facilitates system assembly.

Figure 3:
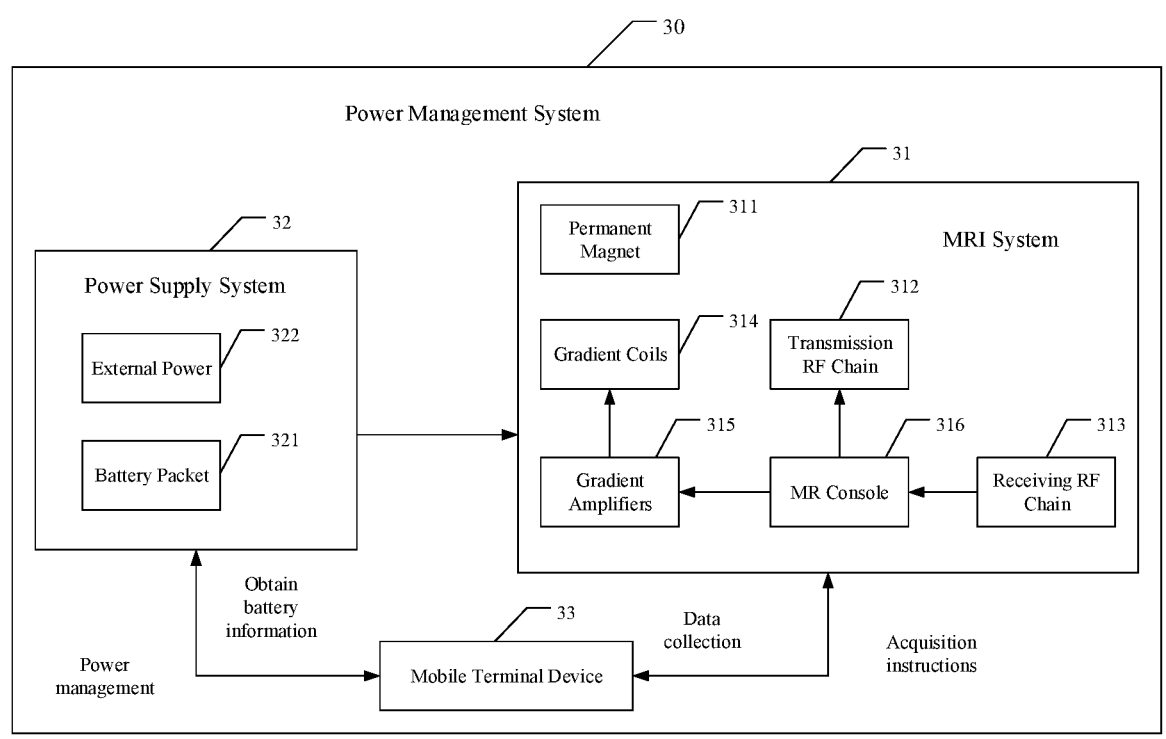
FIG. 3 is a schematic block diagram of an embodiment of an MRI system equipped with a power management system according to the present disclosure.

FIG. 3 is a schematic block diagram of an embodiment of an MRI system equipped with a power management system according to the present disclosure. For the convenience of explanation, only the parts related to this embodiment are shown. In this embodiment, as shown in FIG. 3, A power management system 30 includes: an MRI system 31, a power supply system 32 for supplying power to the MRI system 31, and a mobile terminal device 33.

The power supply system 32 includes: a battery packet 321, and an external power 322. The mobile terminal device 33 is used for collecting battery information, and optimizing charging time of the battery packet based on the battery information. The battery information includes: the remaining capacity of the battery packet 321, the temperature of the battery packet 321, and the surplus availability of the external power 322, etc.

In some embodiments, the battery information is obtained and used to optimize battery performance of the battery packet 321 via an Ethernet cable or wireless connection. The batter performance of the battery packet 321 includes, for example, charging time, charge discharge rate, impedance, service life, and self-discharge rate, etc.

In some embodiments, the MRI system 31 includes: a permanent magnet 311 using SmCo material, a transmission RF chain 312, a receiving RF chain 313, gradient coils 314, gradient amplifiers 315, and an MR console 316. Each of the transmission RF chain 312 and the receiving RF chain 313 includes: RF coils, a RF generator, and RF amplifiers.

In some embodiments, the structure of the MRI system 31 can be the same as the structure of the above MRI system 10 shown in FIG. 1. The structure of the power supply system 32 can be the same as the structure of the above power supply system 20 shown in FIG. 2. The structure of the power management system 30 can be shown in FIG. 4.

In this embodiment, the power management system 30 can run in 3 modes optimized for different scenarios, that is, the power management system 30 has the following three different running modes:

(i) Standby mode, wherein no scan is performed or during the gap between scans;
(ii) Energy-saving mode, wherein the scanning protocols will be optimized for reducing the power consumption, while providing clinically usable MR images; and
(iii) Efficiency mode, wherein the performance is optimized for ultimate image quality within fixed scan time.

In some embodiments, the gradient amplifiers 315 and the RF amplifiers of the transmission RF chain 312 and the receiving RF chain 313 will be automatically operated in the standby mode when no scan is performed. Note that the shimming gradient is also turned off in this mode.

In some embodiments, the sequence can be flattened for energy-saving. Specifically, lower receiving bandwidth and longer phase-encoding/refocusing, which can significantly reduce the gradients, leading to reduced power consumption, can be used.

In some embodiments, the sequences can have decreased RF power. Specifically, by using longer RF duration, the RF amplitude can be inverse proportionally reduced. The energy consumption will also be reduced as:

$$E=aA^2t$$

where E denotes the energy consumption, A denotes the RF amplitude, t denotes the RF duration, and a denotes the constant coefficient.

The flip angle in some sequences (e.g., fast spin echo sequences) can also be reduced for energy saving.

In some embodiments, the power consumption of the MRI system 30 is minimized when there is no scan or between scans, by the MR console 316 controlling the gradient amplifiers 315 and the RF amplifiers of the transmission RF chain 312 and the receiving RF chain 313 into the standby mode.

In some embodiments, the MRI system further includes: a motor system for moving a patient bed or a lifting machine. The power consumption of the MRI system 30 is minimized by turning off the motor system through the MR console 316.

It can be understood by those skilled in the art that FIGS. 1-4 are merely examples of the MRI system 10, the power supply system 20, and the power management System 30, and does not constitute a limitation on the MRI system 10, the power supply system 20, and the power management System 30, and may include more or fewer components than those shown in the figures, or a combination of some components or different components.

Figure 4:
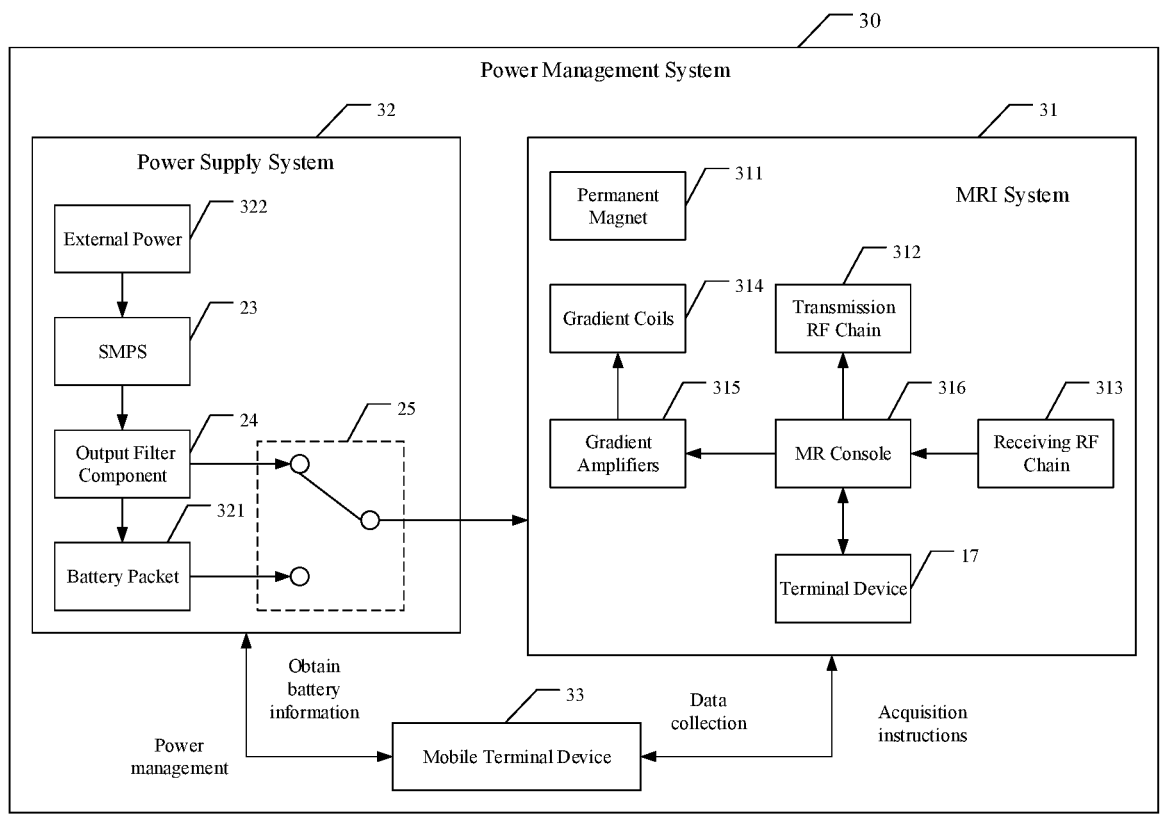
FIG. 4 is a schematic block diagram of another embodiment of an MRI system equipped with the power management system according to the present disclosure.
Figure 5:
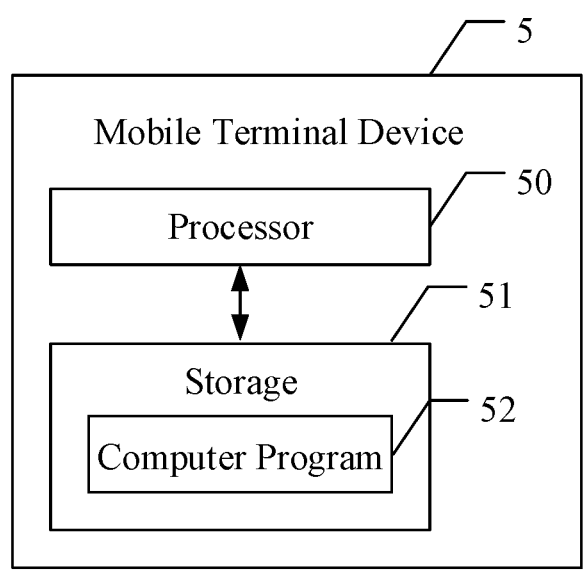
FIG. 5 is a schematic block diagram of an embodiment of the mobile terminal device in FIG. 3 and FIG. 4 according to the present disclosure.

FIG. 5 is a schematic block diagram of an embodiment of the mobile terminal device in FIG. 3 and FIG. 4 according to the present disclosure. In this embodiment, the mobile terminal device 5 may be, for example, a mobile phone, a tablet, and a laptop computer, etc. As shown in FIG. 5, the mobile terminal device 5 includes a processor 50, a storage 51, and a computer program 52 stored in the storage 51 and executable on the processor 50. When executing (instructions in) the computer program 52, the processor 50 implements a power management method applied to the above power management system 30. The power management method includes the following steps:

Step S501, collecting battery information, wherein the battery information includes: a remaining capacity of the battery packet of the power supply system, a temperature of the battery packet, a surplus availability of the external power; and
Step S502, optimizing charging time of the battery packet based on the battery information.

In some embodiments, the above power management method further includes following steps:
Step S503, obtaining an operation state of the MRI system; and
Step S504, switching a running mode of the MRI system according to the operation state of the MRI system.

The running modes includes: the standby mode, the energy-saving mode, and the efficiency mode. For example, when no scan of the MRI system is performed, or during the gap between scans of the MRI system, the mobile terminal device controls the MRI system into the standby mode, to obtain the lowest power consumption. When the MRI system starts a scanning with high accuracy, the mobile terminal device controls the MRI system into the efficiency mode, to optimize the performance of the MRI system for ultimate image quality within fixed scan time. When the MRI system starts a scanning with low accuracy, the mobile terminal device controls the MRI system into the energy-saving mode, to optimize the scanning protocols of the MRI system for reducing the power consumption, while providing clinically usable MR images.

In some embodiments, when no scan is performed, the mobile terminal device controls the gradient amplifiers and the RF amplifiers of the transmission RF chain and the receiving RF chain of the MRI system into the standby mode, and controls the shimming gradient turned off.

In some embodiments, the sequence can be flattened for energy-saving. Specifically, lower receiving bandwidth and longer phase-encoding/refocusing, which can significantly reduce the gradients, leading to reduced power consumption, can be used.

In some embodiments, the sequences can have decreased RF power. Specifically, by using longer RF duration, the RF amplitude can be inverse proportionally reduced. The flip angle in some sequences (e.g., fast spin echo sequences) can also be reduced for energy saving.

In some embodiments, the standby mode, the mobile terminal device controls to turn off the above motor system of the MRI system, for minimizing the power consumption of the MRI system.

In some embodiments, the above power management method further includes following steps:
Step S505, detecting operation states of the external power and the battery packet of the power supply system; and
Step S506, adjusting the power supply mode of the MRI system according to detected operation states.

For example, when the external power is detected as available, the mobile terminal device controls the power switch so that the MRI system is operated only by the external power. Or the mobile terminal device controls the power switch so that the MRI system is driven only by the battery packet, while it is detected that the battery packet is charging.

Exemplarily, the computer program 52 may be divided into one or more modules/units, and the one or more modules/units are stored in the storage 51 and executed by the processor 50 to realize the present disclosure. The one or more modules/units may be a series of computer program instruction sections capable of performing a specific function, and the instruction sections are for describing the execution process of the computer program 52 in the mobile terminal device 5.

It can be understood by those skilled in the art that FIG. 5 is merely an example of the mobile terminal device 5 and does not constitute a limitation on the mobile terminal device 5, and may include more or fewer components than those shown in the figure, or a combination of some components or different components. For example, the mobile terminal device 5 may further include an input/output device, a network access device, a bus, and the like.

The processor 50 may be a central processing unit (CPU), or be other general purpose processor, a digital signal processor (DSP), an application specific integrated circuit (ASIC), a field-programmable gate array (FPGA), or be other programmable logic device, a discrete gate, a transistor logic device, and a discrete hardware component. The general purpose processor may be a microprocessor, or the processor may also be any conventional processor.

The storage 51 may be an internal storage unit of the mobile terminal device 5, for example, a hard disk or a memory of the mobile terminal device 5. The storage 51 may also be an external storage device of the mobile terminal device 5, for example, a plug-in hard disk, a smart media card (SMC), a secure digital (SD) card, flash card, and the like, which is equipped on the mobile terminal device 5. Furthermore, the storage 51 may further include both an internal storage unit and an external storage device, of the mobile terminal device 5. The storage 51 is configured to store the computer program 52 and other programs and data required by the mobile terminal device 5. The storage 51 may also be used to temporarily store data that has been or will be output.

In addition, each of the functional units in each of the embodiments of the present disclosure can be integrated in one processing unit. Each unit can be physically exists alone, or two or more units can be integrated in one unit. The above-mentioned integrated unit can be implemented either in the form of hardware, or in the form of software functional units.

The integrated unit can be stored in a computer-readable storage medium if it is implemented in the form of a software functional unit and sold or utilized as a separate product. Based on this understanding, the technical solution of the present disclosure, either essentially or in part, contributes to the prior art, or all or a part of the technical solution can be embodied in the form of a software product. The software product is stored in a storage medium, which includes a number of instructions for enabling a computer device (which can be a personal computer, a server, a network device, etc.) or a processor to execute all or a part of the steps of the methods described in each of the embodiments of the present disclosure. The above-mentioned storage medium includes a variety of media such as a USB disk, a mobile hard disk, a read-only memory (ROM), a random access memory (RAM), a magnetic disk, and an optical disk which is capable of storing program codes.

As mentioned above, the forgoing embodiments are merely intended for describing but not for limiting the technical schemes of the present disclosure. Although the present disclosure is described in detail with reference to the above-mentioned embodiments, it should be understood by those skilled in the art that, the technical schemes in each of the above-mentioned embodiments may still be modified, or some of the technical features may be equivalently replaced, while these modifications or replacements do not make the essence of the corresponding technical schemes depart from the spirit and scope of the technical schemes of each of the embodiments of the present disclosure, and should be included within the scope of the present disclosure.

What is claimed is:

1. A magnetic resonance imaging (MM) system with low-power miniaturization, comprising:
   a permanent magnet using samarium-cobalt material;
   a magnetic resonance (MR) console;
   a transmission radio frequency (RF) chain;
   a receiving RF chain;
   gradient coils;
   gradient amplifiers; and
   a terminal device for user interactions, wherein the terminal device is electrically coupled to the MR console and configured for managing the MM system;
   wherein the terminal device is further configured for obtaining an operation state of the MRI system, and switching a running mode of the MM system according to the operation state of the MRI system, and wherein running modes of the MM system comprises: a standby mode, an energy-saving mode, and an efficiency mode.

2. The MRI system with low-power miniaturization of claim 1, wherein the MRI system is operated using any one of a standard alternating current (AC) power socket, a battery packet for 12 hours operation per charge, and a portable generator.

3. The MRI system with low-power miniaturization of claim 1, wherein the terminal device is a personal desktop computer, or a mobile terminal device.

4. The power supply system of claim 1, wherein the MM system is operated without the battery packet, when the external power is available or the battery packet is charging; and wherein the MRI system is driven by the battery packet when the external power is not available.

5. The MRI system with low-power miniaturization of claim 1, wherein when no scan of the MM system is performed, or during a gap between scans of the MM system, the mobile terminal device controls the MM system into the standby mode;
   when the MM system starts a first scan, the mobile terminal device controls the MRI system into the efficiency mode;
   when the MRI system starts a second scan, the mobile terminal device controls the MM system into the energy-saving mode, wherein time efficiency of the second scan is lower than time efficiency of the first scan.

6. The MM system with low-power miniaturization of claim 5, wherein the MM system further comprises a motor system for moving a patient bed or a lifting machine; and
   wherein when no scan is performed, the mobile terminal device controls the gradient amplifiers and the RF amplifiers of the transmission RF chain and the receiving RF chain of the MRI system into the standby mode, and controls the MR console to turn off a shimming gradient and the motor system.

7. The MM system with low-power miniaturization of claim 1, wherein the terminal device is further configured for detecting operation states of an external power and a battery packet of a power supply system, and adjusting a power supply mode of the MM system according to detected operation states.

8. The MRI system with low-power miniaturization of claim 7, wherein when the external power is detected as available or the battery packet is charging, the mobile terminal device controls a power switch of the power supply system so that the MRI system is operated only by the external power; and when the external power is not available, the mobile terminal device controls the power switch so that the MM system is driven only by the battery packet.

9. A power supply system for supplying power to a magnetic resonance imaging (MM) system with low-power miniaturization, comprising:
an external power, configured to supply alternating current (AC) power;
a battery packet;
a switched-mode power supply (SMPS), configured to transfer the AC power to direct current (DC) load, wherein an input of the SMPS is connected to the external power;
an output filter component connected to an output of the SMPS, wherein the output filter component is configured to improve stability of a DC output of the SMPS; and
a power switch, wherein a common end of the power switch is connected to the output filter component and the battery packet, and a fixed contact of the power switch is connected to the MRI system;
wherein the power switch is controlled by a terminal device, and wherein the terminal device detects operation states of the external power and the battery packet, and controls the power switch to adjust a power supply mode of the MM system according to detected operation states.

10. The power supply system of claim 9, wherein the external power is a standard AC power socket or a portable generator.

11. The power supply system of claim 10, wherein the portable generator is driven by a solar power or fuel.

12. The power supply system of claim 9, wherein the output filter component is built with at least one inductor, or at least one capacitor, or combinations of the at least one inductor and the at least one capacitor.

13. The power supply system of claim 9, wherein the power supply system is designed with fast battery swapping.

14. The power supply system of claim 9, wherein each charge of the battery packet is performed within 4 hours with the standard AC power socket, and used for 12 hours operation.

15. The power supply system of claim 9, wherein the battery packet is made of a lithium-ion or Li-ion polymer material.

16. A power management system, comprising:
a magnetic resonance imaging (MM) system;
a power supply system for supplying power to the MM system, wherein the power supply system comprises: a battery packet, and an external power; and
a mobile terminal device, configured for:
collecting battery information, wherein the battery information comprises: the remaining capacity of the battery packet, the temperature of the battery packet, and the surplus availability of the external power;
optimizing charging time of the battery packet based on the battery information; and
obtaining an operation state of the MRI system, and switching a running mode of the MRI system according to the operation state of the MM system, and wherein running modes of the MRI system comprises: a standby mode, an energy-saving mode, and an efficiency mode.

17. The power management system of claim 16, wherein the battery information is obtained and used to optimize battery performance of the battery packet via an Ethernet cable or wireless connection.

18. The power management system of claim 16, wherein the power management system has three different running modes comprising a standby mode, an energy-saving mode, and an efficiency mode; and
wherein the standby mode of the power management system corresponds to no scan being performed or a gap between scans;
the energy-saving mode of the power management system corresponds to scanning protocols being optimized for reducing power consumption while providing clinically usable MR images, and
the efficiency mode of the power management system corresponds to a performance being optimized for ultimate image quality within a fixed scan time.

19. The power management system of claim 18, wherein the MRI system comprises: a permanent magnet using samarium-cobalt material, an magnetic resonance (MR) console, a transmission radio frequency (RF) chain, a receiving RF chain, gradient coils, and gradient amplifiers;
wherein a gradient generator is integrated in the MR console, and the MR console is configured to:
generate gradient waveforms for three predefined orthogonal directions,
generate RF waveforms,
convert amplified receiving RF signals into digital signals and transfer the digital signals to the terminal, and
control timing for gradient waveforms or RF waveforms generation and data acquisition;
wherein each of the transmission RF chain and the receiving RF chain comprises: RF coils, a RF generator integrated in the MR console, and RF amplifiers; and
wherein power consumption of the MRI system is minimized when there is no scan or between scans, by the MR console controlling the gradient amplifiers and RF amplifiers of the transmission RF chain and the receiving RF chain into the standby mode.

20. The power management system of claim 19, wherein the MRI system further comprises: a motor system for moving a patient bed or a lifting machine; and
wherein the power consumption of the MRI system is minimized by turning off the motor system through the MR console.

* * * * *